United States Patent
Kobayashi et al.

(10) Patent No.: US 6,629,362 B2
(45) Date of Patent: Oct. 7, 2003

(54) METHOD OF MANUFACTURING A CIRCUIT PRINT BOARD

(75) Inventors: Takashi Kobayashi, Tokyo (JP); Seiji Oka, Tokyo (JP); Kazuo Funahashi, Tokyo (JP); Hideki Tsuruse, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 142 days.

(21) Appl. No.: 09/777,940

(22) Filed: Feb. 7, 2001

(65) Prior Publication Data

US 2001/0010250 A1 Aug. 2, 2001

Related U.S. Application Data

(63) Continuation of application No. PCT/JP99/03291, filed on Jun. 21, 1999.

(51) Int. Cl.[7] .............................................. H05K 3/36
(52) U.S. Cl. .......................... 29/830; 29/825; 29/846; 29/852
(58) Field of Search ........................ 29/825, 829, 830, 29/852, 846

(56) References Cited

U.S. PATENT DOCUMENTS 4,591,659 A    5/1986    Leibowitz

FOREIGN PATENT DOCUMENTS

| EP | 0147014 | 3/1985 |
|---|---|---|
| JP | 60-140898 | 7/1985 |
| JP | 4-299892 | * 10/1992 |
| JP | HEI 4-359496 | 12/1992 |
| JP | HEI 5-11475 | 2/1993 |
| JP | HEI 5-291715 | 11/1993 |
| JP | HEI-8-23183 | 1/1996 |
| WO | WO00/79848 | 12/2000 |

* cited by examiner

Primary Examiner—Carl J. Arbes
(74) Attorney, Agent, or Firm—Burns, Doane, Swecker & Mathis, LLP (57) ABSTRACT

The present invention is provided to prevent a rise of temperature of a heating element and temperature of a board by inserting a graphite sheet 1 having high thermal conductivity to a circuit print board without electrically connecting with a conductive hole 6. In order to accomplish the above object, a manufacturing method of a circuit print board according the present invention has a thermal diffusive sheet forming step for forming the thermal diffusive sheet 7 by bonding resin 2 to a graphite sheet 1. Next, the method has a through hole making step for making the through hole on the thermal diffusive sheet and an insulator bonding step for forming a core 10 by thermally pressing the insulator to the thermal diffusive sheet having the through hole 3. Through these steps, the graphite sheet 1 can be inserted into the circuit print board without electrically connecting with the conductive hole 6.

8 Claims, 13 Drawing Sheets

13 : THERMAL SOURCE
12 : CIRCUIT PRINT BOARD
11 : PATTERNED GRAPHITE SHEET
6 : CONDUCTIVE HOLE

Fig.8

6 : CONDUCTIVE HOLE
20 : AREA LOCATED DIRECTLY BENEATH THE THERMAL SOURCE
11 : PATTERNED GRAPHITE SHEET
21 : AREA FROM WHICH GRAPHITE IS CUT

METHOD OF MANUFACTURING A CIRCUIT PRINT BOARD

This is a continuation of international application No. PCT/JP99/03291 filed on Jun. 21, 1999, which International Application was published by the International Bureau in Japanese on Dec. 28, 2000.

TECHNICAL FIELD

The present invention relates to a circuit print board manufacturing method and a circuit print board, in particular, to a circuit print board manufacturing method, a circuit print board, and a carbon sheet, in which a rise of a temperature of the board caused by down-sizing and integration of the circuit print board can be prevented.

BACKGROUND ART

According to recent down-sizing and integration of the electric device such as a portable computer and a cellular phone, a circuit print board installed in the electric device has been also down-sized and integrated from a single-sided board to a double-sided board and a multilayered board. However, as the down-sizing and integration of the circuit print board are performed, the rise of the temperature of the heating element itself, the temperature of the circuit print board, the temperature of the frame of the electric device due to the heat radiated from the heating element such as an LSI and a power amplifier installed in the circuit print board have become problems.

Figure 15:
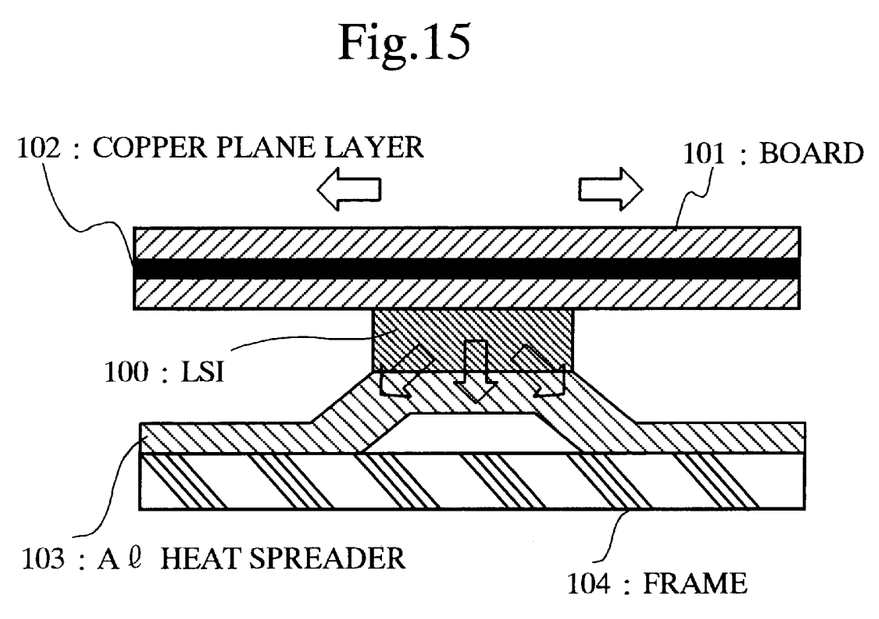
FIG. 15 shows a conventional method for radiating heat generated by heating element.

Under this circumstance, conventionally, as shown in FIG. 15, the heat is effectively released by thickening a copper plane layer 102 of a board 101. In another way, as shown in FIG. 15, a metal layer (Al heat spreader 103) having a good thermal conductivity such as aluminum is provided between the heating element such as an LSI 100 and a frame 104 so as to diffuse the heat generated by the heating element and to prevent the rise of the temperature.

When the heat is diffused and the rise of the temperature of the heating element etc. is prevented in the way as described above, however, there are some problems as described below: namely, the weight of the electric device increases because the density of the copper or the aluminum (mass per volume) is high; and further, it is required to have a space for installing the heat spreader, which may prevent the down-sizing of the electric device.

Graphite is known to have a smaller density than copper or aluminum and a good thermal conductivity in a plane direction. The Japanese Utility Model Gazette HEI 5-11475 disclosed a method for improving the heat radiation effect by inserting the graphite sheet into the board. However, this method relates to printing a circuit on one surface of the board, and is not applied to the board having a through hole. A double-sided board having the circuits on both sides or a multilayered board having the circuits formed on multiple layers has a through hole plated by the conductive material on the side surface. Since the graphite sheet has an electric conductivity, when the graphite sheet is simply inserted into the multilayered board, the graphite sheet makes short-circuit with the through hole.

Figure 16:
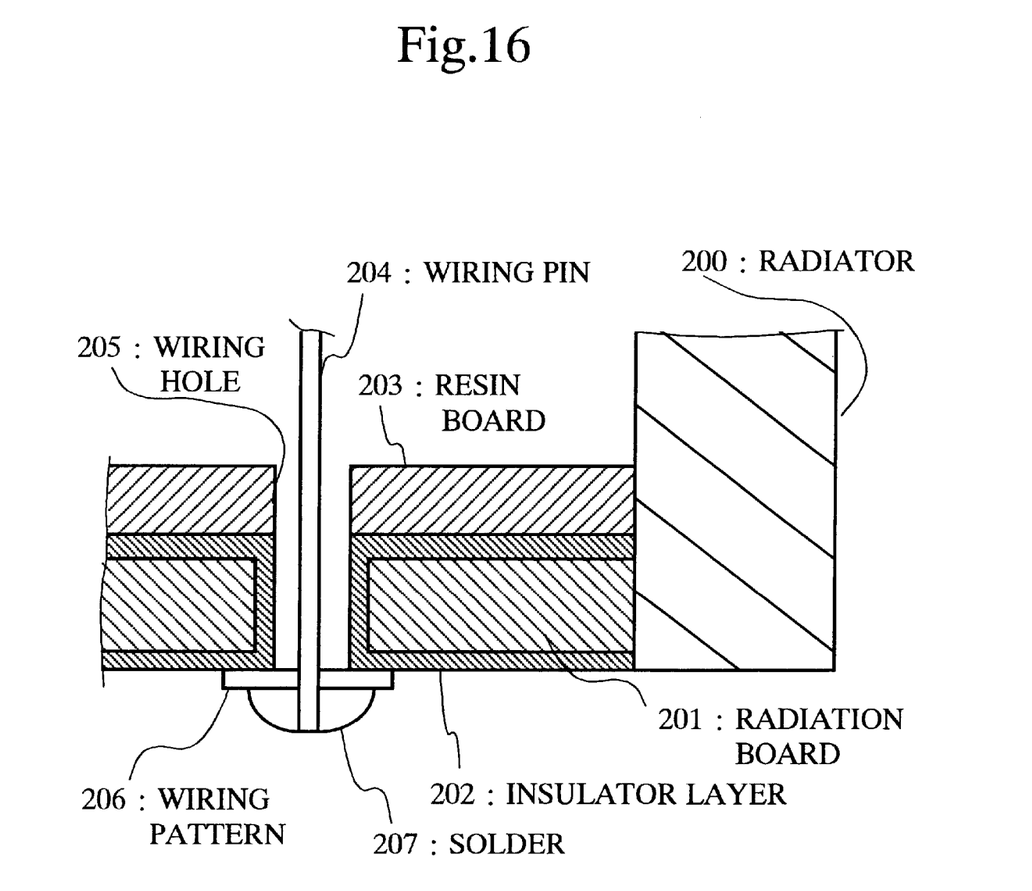
FIG. 16 is a simplified figure disclosed in prior art (Japanese unexamined patent publication No. HEI 8-23183).

As shown in FIG. 16, another prior art, Japanese Unexamined Patent Publication No. HEI 8-23183 disclosed a partial cross sectional view of a circuit print board where a wiring hole 205 is provided to a resin board 203 and a radiation board 201 (a graphite sheet) is bonded to the circuit print board through an insulator layer 202. In FIG. 16, the resin board 203 and the radiation board 201 are contacted with a radiator 200. A wiring pin 204 is connected with a wiring pattern 206 through the wiring hole 205.

However, the prior art does not disclose a process for forming a structure shown in FIG. 16, so that how to form the structure is not clear. In other words, it is not clearly understood from the description of the above prior art when and how a step for bonding the radiation board 201 to the resin board 203 is placed in the manufacturing process of the circuit print board. It is not clearly understood from the description of the above prior art whether the radiation board 201 is formed by another process independent from the manufacturing process of the circuit print board, and so on. Especially, it is not clear how the insulator layer 202 provided to the side surface of the wiring hole 205 is formed so as to prevent the electrical connection between the radiation board 201 (the graphite sheet) and the wiring hole 205.

The present invention is provided to solve the above problems and aims to prevent the rise of the temperature of the heating element itself, the temperature of the circuit print board, the temperature of the frame of the electric device due to the heat radiated from the heating element such as the LSI and the power amplifier installed in the circuit print board as well as accomplishing down-sizing of the circuit print board.

Another object of the invention is to easily manufacture a circuit print board with a high efficiency of the radiation using manufacturing process of the circuit print board.

DISCLOSURE OF THE INVENTION

According to the present invention, a method for manufacturing a circuit print board includes:

a through hole making step for making a through hole penetrating a thermal diffusive sheet which is a carbon sheet bonded by substance supporting the carbon sheet; and an insulator bonding step for forming a core by bonding insulator to a side surface of the through hole made at the through hole making step.

The above carbon sheet is a graphite sheet.

The method for manufacturing the circuit print board according to the present invention further includes:

a circuit patterning step for forming circuits on both sides of the core formed at the insulator bonding step;

a conductive hole making step for making a conductive hole penetrating the core with the circuits formed at the circuit patterning step; and a connection step for placing conductive material to a side surface of the conductive hole formed at the conductive hole making step.

The method for manufacturing the circuit print board according to the present invention further includes:

a conductive hole making step for making a conductive hole penetrating the core formed at the insulator bonding step;

a circuit patterning step for forming circuits on both sides of the core having the conductive hole made at the conductive hole making step; and a connection step for placing conductive material to a side surface of the conductive hole formed at the conductive hole making step.

Further, the method for manufacturing the circuit print board according to the present invention includes, before the through hole making step, a thermal diffusive sheet forming step for forming a thermal diffusive sheet by bonding substance supporting the carbon sheet to the carbon sheet.

The above insulator bonding step bonds the insulator to the side surface of the through hole by compressing the insulator to the thermal diffusive sheet having the through hole made at the through hole making step.

The above insulator bonding step bonds by plugging the insulator in the through hole made at the through hole making step.

The through hole making step makes the through hole having a greater diameter than the conductive hole made at the conductive hole making step.

According to the present invention, a method for manufacturing a circuit print board includes:

a patterning step for cutting a predetermined area from a carbon sheet; and a core forming step for forming a core by bonding insulator to both sides of the carbon sheet from which the predetermined area is cut at the patterning step.

The above carbon sheet is a graphite sheet.

The method for manufacturing the circuit print board according to the present invention further includes:

a circuit patterning step for forming circuits on both sides of the core formed at the core forming step;

a conductive hole making step for making a conductive hole penetrating the core formed at the circuit patterning step; and a connection step for bonding conductive material to a side surface of the conductive hole made at the conductive hole making step.

Further, the method for manufacturing the circuit print board according to the present invention includes:

a conductive hole making step for making a conductive hole penetrating the core formed at the core forming step;

a circuit patterning step for forming circuits on both sides of the core having the conductive hole made at the conductive hole making step; and a connection step for placing conductive material to a side surface of the conductive hole made at the conductive hole making step.

According to the present invention, a circuit print board includes: multilayered circuits formed by laminating layers having interlayer insulator;

a carbon sheet provided between the multiple circuits and having a pattern made by cutting a predetermined area and multiple conductive holes provided within the predetermined area-cut from the carbon sheet and plugged with conductive material for electrically connecting the multilayered circuits.

The above carbon sheet is a graphite sheet.

The above carbon sheet has the pattern made by cutting the predetermined area so as to be along a direction of thermal diffusion of heat radiated from a heating element mounted on the circuit print board.

The above carbon sheet has a pattern made by cutting an area from which heat radiated from a heating element mounted on a circuit print board is more difficult to be diffused rather than an area from which heat is easy to diffused.

A carbon sheet according to the present invention has a pattern made by cutting a predetermined area so as to be used for the circuit print board according to the present invention.

BEST MODE FOR CARRYING OUT THE INVENTION

Embodiment 1

A case will be explained in which a manufacturing method of a circuit print board having a carbon sheet with good thermal conductivity inserted is applied to a manufacturing method of multilayered circuit print board having multilayered circuits. The carbon sheet means a sheet containing simple substance of carbon. For example, the carbon sheet is a graphite sheet mainly consisting of graphite, a sheet mainly consisting of graphite intercalation compound, a sheet mainly consisting of amorphous carbon, a sheet containing carbon fiber and so on. The first through fifth embodiment will be explained using a graphite sheet mainly consisting of graphite for an example of carbon sheet having good thermal conductivity. From a view point of improving thermal conductivity, it is desirable to use graphite which has high purity and high orientation and has a structure close to monocrystal.

Figure 1:
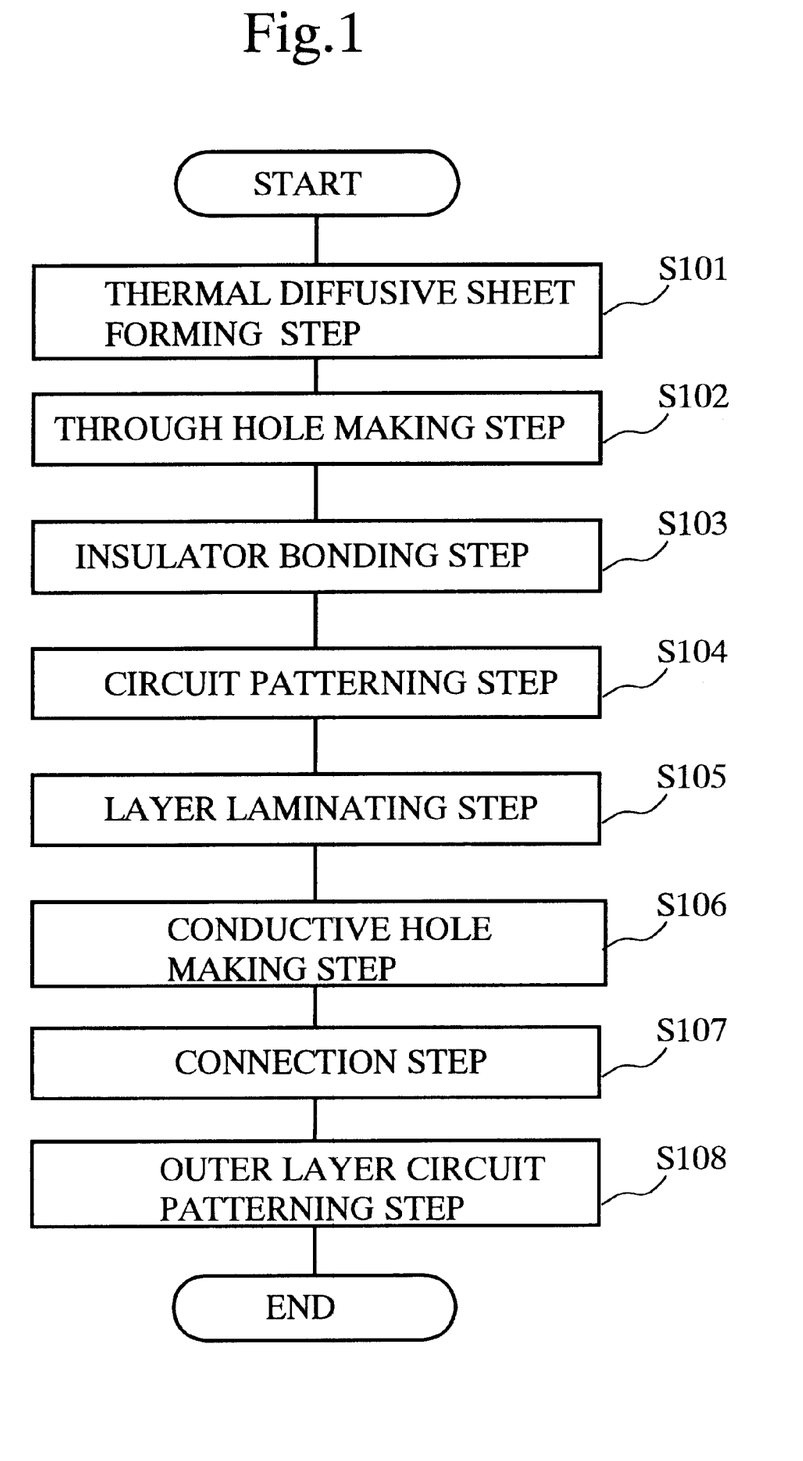
FIG. 1 is a flowchart showing a manufacturing method of a circuit print board according to the first embodiment.

FIG. 1 is a flowchart showing a circuit print board manufacturing method according to the first embodiment. Further, FIG. 2 is a series of end views showing manufacturing process of the circuit print board.

Figure 2A:
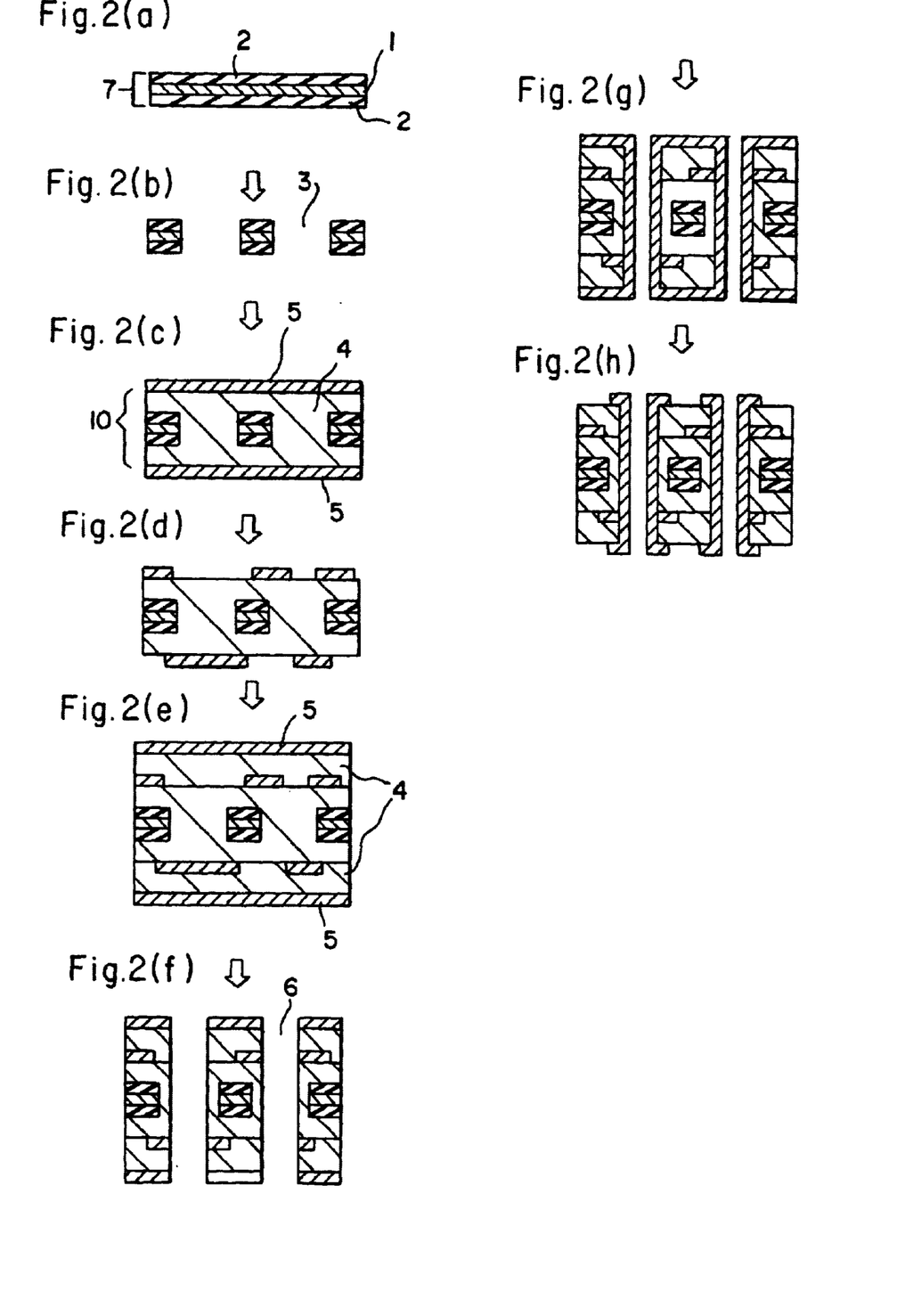
FIG. 2 is a series of end views showing the manufacturing process of the circuit print board according to the first embodiment.

In FIG. 1, the circuit print board manufacturing method of the first embodiment has a thermal diffusive sheet forming step S101 for forming a thermal diffusive sheet 7 which is a graphite sheet 1 and substance bonded to the graphite sheet 1 for supporting the graphite sheet 1 ((a) in FIG. 2). The graphite sheet 1 used in the present invention has a thickness of around 100μ. Accordingly, it is difficult to make a through hole at a predetermined position on such a thin graphite sheet 1, so that the thermal diffusive sheet forming step S101 is provided. Namely, the strength of the substance bonded to the graphite sheet 1 is sufficient to support the graphite sheet 1 on making the through hole. For example, it is desirable to use synthetic resin which is an insulator. Or, it should not always be the insulator, but can be conductive material such as copper. To bond the substance supporting the graphite sheet 1 to the graphite sheet 1, such as adhesive can be used, or thermal compression can be used. In order to down-size the circuit print board, it is required to lessen the thickness of the circuit print board. Consequently, the substance bonded to the graphite sheet 1 is desirable to be as thin as possible within a range of thickness sufficient for accomplishing the above purpose. Further, upper and lower resins 2 do not have to have the same thickness. The graphite sheet 1 and the substance supporting the graphite sheet do not have to be similar size. Namely, the graphite sheet 1 can be smaller than the substance supporting the graphite sheet.

Next, the manufacturing method of FIG. 1 has a through hole making step S102 for making a through hole 3 penetrating the thermal diffusive sheet 7 which is formed at the thermal diffusive sheet forming step S101 ((b) in FIG. 2). This through hole making step S102 is provided for avoiding a short-circuit due to the contact of the graphite sheet 1 with a conductive hole which will be produced on the circuit print board. As a concrete process, the through hole 3 is produced by drilling. In another way, the through hole 3 can be produced by laser.

An essential object of the through hole making step S102 is not to provide the thermal diffusive sheet 7 with a through hole, but provide the graphite sheet with a pattern so as not to electrically connect with the circuit being formed thereafter. If graphite is soluble by acid as metal, the graphite can be removed by etching. However, actually, the graphite is not soluble by acid, and etching cannot be performed. Accordingly, it is required to provide the through hole making step S102 for physically making the through hole 3, which is larger than a conductive hole 6 being formed thereafter, on the graphite sheet 1.

Next, the circuit print board manufacturing method according to the first embodiment has an insulator bonding step S103 for forming a core 10 by thermally pressing insulator coated with Cu film 5 to the thermal diffusive sheet 7 having the through hole 3 ((c) in FIG. 2). This insulator bonding step S103 is a necessary step for insulating a side surface of the through hole 3. For the insulator bonded to the thermal diffusive sheet 7, glass epoxy resin 4, which is used for usual circuit print board manufacturing method, can be used. By thermally pressing the thermal diffusive sheet 7 having the through hole 3 with the glass epoxy resin 4 from both sides, the glass epoxy resin 4 is plugged up to the side surface of the through hole 3, and the core 10 can be thus produced. The insulator bonding step S103 is constituted in this way, it is possible to plug the through hole 3 with the insulator without providing additional step for plugging the through hole 3 with the insulator.

In another way, at the insulator bonding step S103, the through hole 3 can be plugged with the insulator by coating or screen printing insulator such as optical thermosetting insulating resin or thermosetting resin on the thermal diffusive sheet 7 having the through hole 3. In this case, the core 10 corresponds to the thermal diffusive sheet 7 having the through hole 3 plugged with the insulator. Further, the substance supporting the graphite sheet 1 is required to be insulator.

Next, the circuit print board manufacturing method according to the first embodiment has a circuit patterning step S104 for patterning a circuit on the Cu film 5 coated on the both sides of the core 10. At this circuit patterning step S104, a circuit is formed by coating resist, performing exposure/development, and etching process. Then, the method has a layer laminating step S105 for forming multilayered circuit. Further, the method has a conductive hole making step S106. At this conductive hole making step S106, a conductive hole 6 having a smaller diameter than the through hole 3 is produced on each through hole 3 using a drill or laser to electrically connect multilayered circuits. The conductive hole 6 is produced at a center of the through hole 3. By producing the conductive hole 6 in the above way, it is possible to prevent exposure of the graphite from the side surface of the conductive hole 6. Subsequently, the method has a connection step S107 for placing conductive material to the side surface of the conductive hole formed at the conductive hole making step S106. At this connection step S107, plating process is performed. Then, the method has an outer layer circuit patterning step S108 for forming a circuit on the outermost layer.

In case of not forming multilayered circuit, but forming circuits on both sides of the board (without performing the layer laminating step S105), the present invention can be constituted as below. Namely, after the insulator bonding step S103, the conductive hole making step S106 is performed, and then the circuit patterning step S104 and the connection step S107 follow.

The circuit print board manufacturing method according to the first embodiment is constituted as described above, and in the following, the operation and effect will be explained. As shown in (a) of FIG. 2, the thermal diffusive sheet 7 is formed by the plane graphite sheet 1 bonded from both sides with the resin 2 on which adhesive (not shown in figure) is coated (the thermal diffusive sheet forming step S101). Then, as shown in (b) of FIG. 2, the through hole 3 is made on the thermal diffusive sheet 7 (the through hole making step S102). Next, as shown in (c) of FIG. 2, the thermal diffusive sheet 7 having the through hole 3 is thermally pressed from both sides with the glass epoxy resin 4 on which the Cu film 5 is coated, to form the core 10 (the insulator bonding step S103). Further, resist coating, exposure/development, etching process is performed to the Cu film 5 which is bonded to the core 10, to pattern the circuit as shown in (d) of FIG. 2 (the circuit patterning step S104). Yet further, as shown in (e) of FIG. 2, the glass epoxy resin 4, on one face of which the Cu film 5 is coated, is thermally pressed (layer laminating step S105), and the board having multilayered circuit is made to produce the conductive hole 6 as shown in (f) of FIG. 2 (the conductive hole making step S106). Subsequently, as shown in (g) and (h) of FIG. 2 the side surface of the conductive hole 6 is plated with Cu (connection step S107), and the circuit is patterned on the surface of the board (the outer layer circuit patterning step S108).

As described above, the multilayered circuit print board can be produced having the conductive graphite sheet 1 located in the core 10 without contacting to the conductive hole 6.

The through hole making step S102 is provided to prevent contact of the conductive hole 6 and the graphite sheet 1. Not only this effect, but the following effect can be also obtained by plugging the insulator to the through hole 3 made at the through hole making step S102, at the insulator bonding step S103. That is, though the graphite sheet 1 itself tends to peel off, since the graphite sheet 1 is fixed by the insulator from both sides via the through hole 3, peeling off can be thus prevented.

According to the first embodiment, the method has the thermal diffusive sheet forming step S101 for forming the thermal diffusive sheet 7 by bonding the substance supporting the graphite sheet 1 to the graphite sheet 1. However, a ready-made sheet, which is the graphite sheet 1 coated by synthetic resin, can be used for the thermal diffusive sheet 7. In this case, the thermal diffusive sheet forming step S101 is not needed, and the method can be started with the through hole making step S102.

Figure 3:
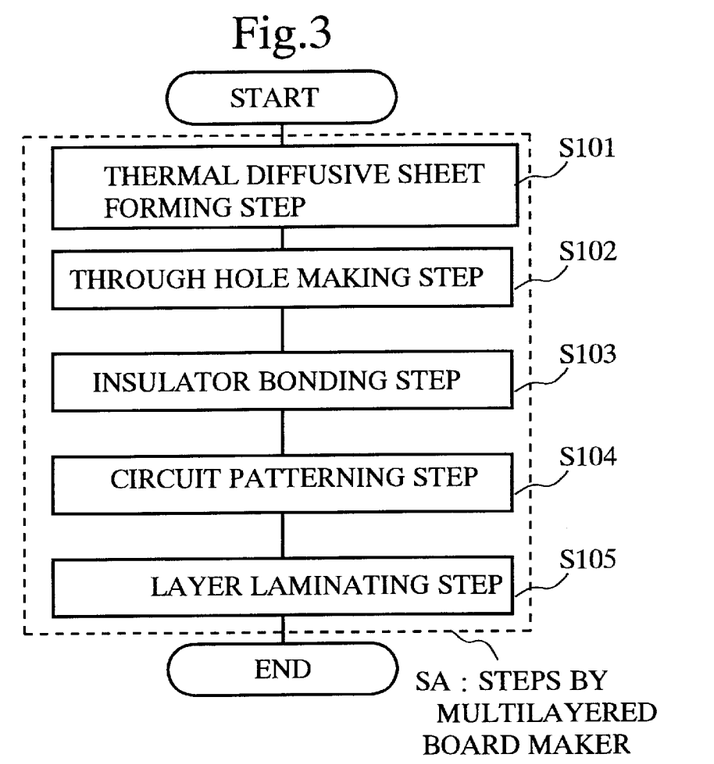
FIG. 3 is a flowchart showing steps performed by a multilayered board maker.
Figure 4:
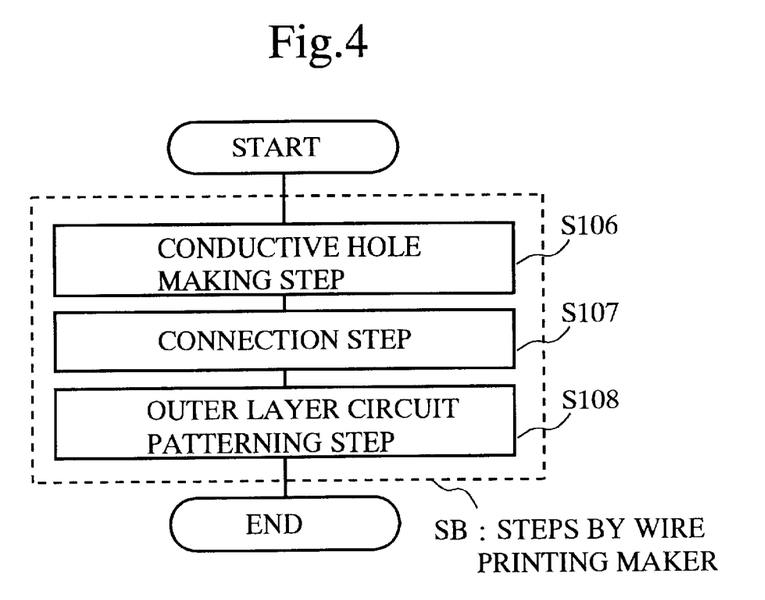
FIG. 4 is a flowchart showing steps performed by a wire printing maker.
Figure 5A:
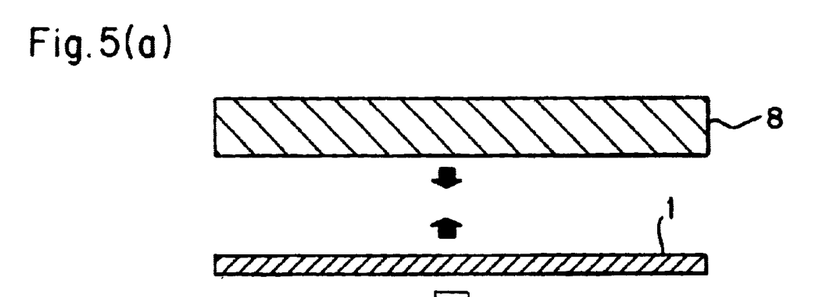
FIG. 5 is a series of end views showing a manufacturing method of the circuit print board according to the second embodiment.
Figure 5B:
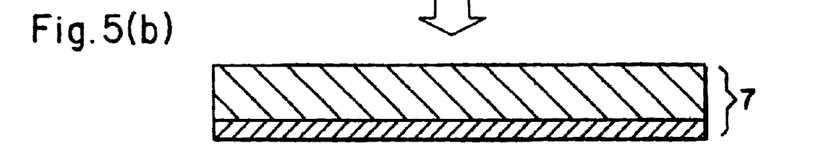
Figure 5C:
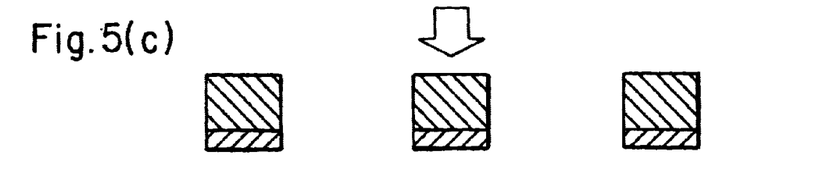
Figure 5D:
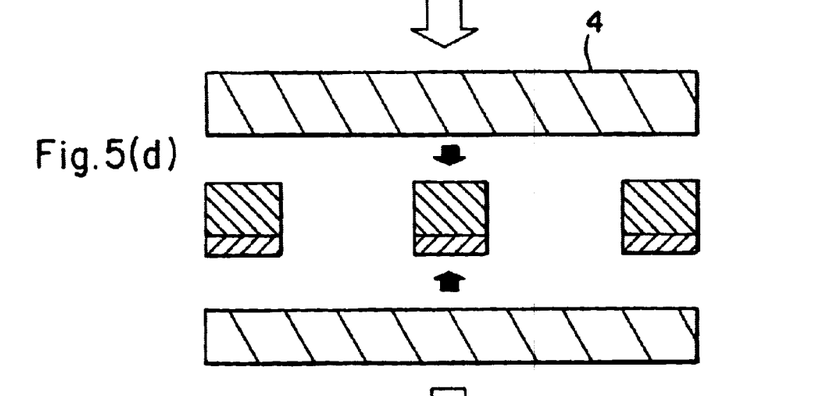
Figure 5E:
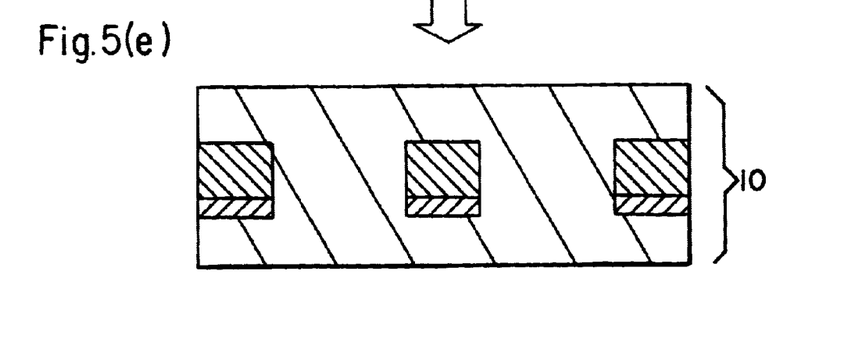

Further, in the above explanation of the first embodiment, one producing maker is assumed to perform a whole procedure shown in FIG. 1. However, as shown in FIGS. 3 and 4, on producing the multilayered circuit print board, steps up to the layer laminating step S105 for forming an inner layer circuit are performed by a multilayered board maker (step SA by multilayered board maker), and then steps from the conductive hole making step S106 through the outer layer circuit patterning step S108 can be performed by a wire print board maker (step SB by wire printing maker). In this case, the present invention is embodied by the multilayered board maker.

Embodiment 2

In the above explanation of the first embodiment, at the thermal diffusive sheet forming step S101, the graphite sheet 1 is bonded with the resin 2 from the both sides. In the second embodiment, another case will be explained, in which copper having high thermal conductivity is bonded only to one side of the graphite sheet 1.

The circuit print board manufacturing method according to the second embodiment has steps shown in FIG. 1 as well as the circuit print board manufacturing method of the first embodiment.

In the following, the operation and effect of the method for manufacturing the circuit print board having the graphite sheet with high thermal conductivity inserted will be explained. As shown in (a) of FIG. 5, the thermal diffusive sheet 7 is formed by bonding copper 8 on which adhesive (not shown in the figure) is coated, to the plane-type graphite sheet 1 from the one side (the thermal diffusive sheet forming step S101). Then, as shown in (b) of FIG. 5, the through hole 3 is made on the thermal diffusive sheet 7 (the through hole making step S102). Subsequently, as shown in (c) of FIG. 5, the thermal diffusive sheet 7 having the through hole 3 is thermally pressed with the glass epoxy resin 4 from both sides to form the core 10 (the insulator bonding step S103). The steps thereafter will be the same as the first embodiment.

As described above, by supporting the graphite sheet 1 with the copper 8 having high thermal conductivity, the thickness of the circuit print board can be lessened, and further the graphite sheet 1 having high thermal conductivity can be inserted to the circuit print board. Yet further, efficient thermal diffusion can be performed. The substance supporting the graphite sheet 1 from one side can be insulator.

Embodiment 3

In the explanation for the first and second embodiments, the graphite sheet 1 is insulated from the circuit via the conductive hole 6 by providing the through hole 3 having a larger diameter than the conductive hole 6 at the location of the conductive hole 6. That is, the through hole is provided for each conductive hole 6. In this case, precise positioning of the through hole 3 and the conductive hole 6 is important. In the third embodiment, another manufacturing method of the circuit print board having the graphite sheet 1 inserted will be explained, in which a precise positioning is not required.

Figure 6:
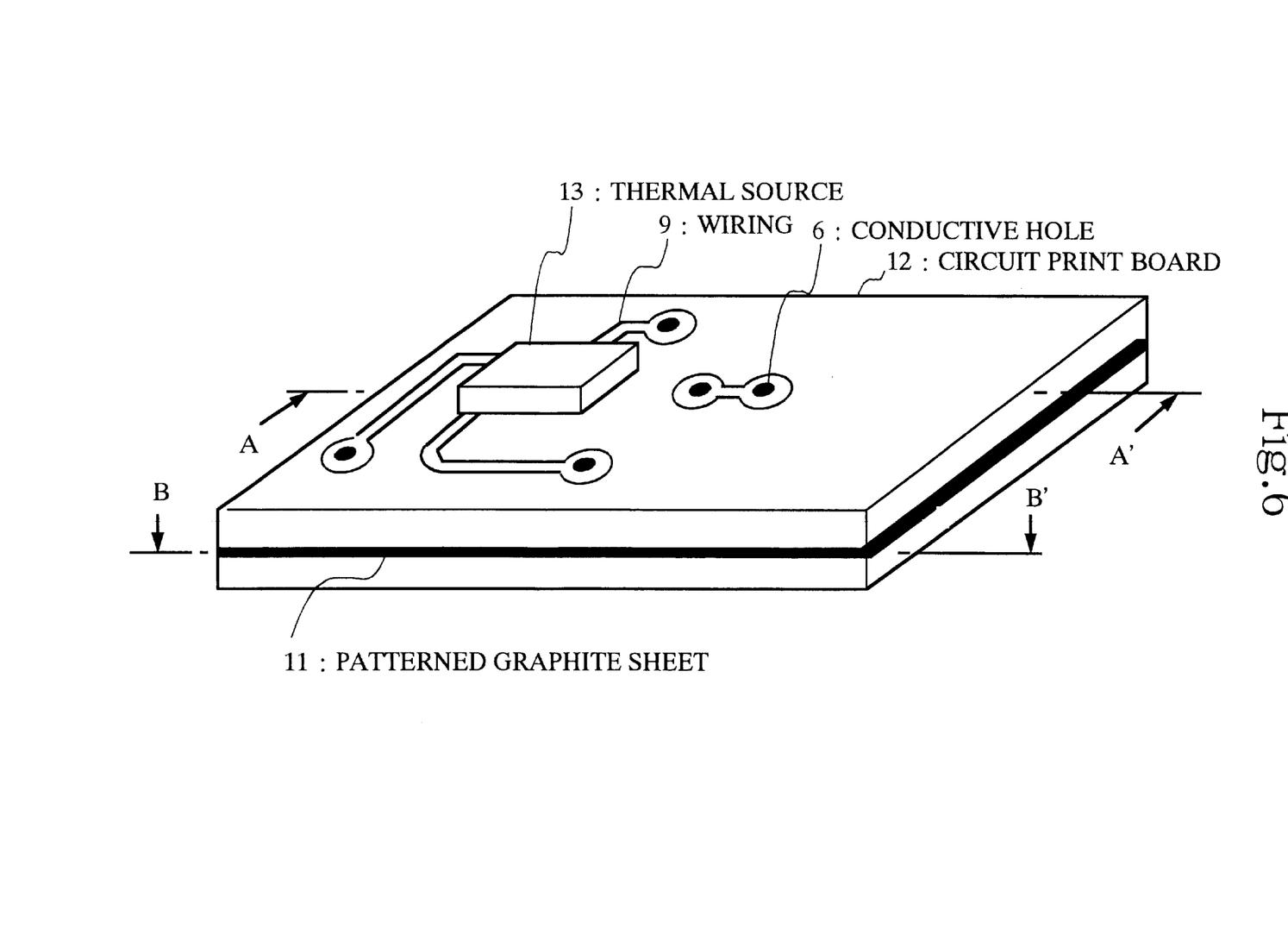
FIG. 6 is a perspective view showing a sketch of a multilayered circuit print board having a graphite sheet inserted.

FIG. 6 is a general perspective view showing the multilayered circuit print board having the graphite sheet 1 inserted.

In FIG. 6, the circuit print board 12 has the conductive hole 6, a patterned graphite sheet 11 and thermal source 13. The thermal source 13 is heating element such as an LSI, a CPU, a power transistor, a power amplifier. The conductive hole 6 is provided to electrically connect the circuits formed both sides of the graphite sheet. The pattered graphite sheet 11 is provided for immediate thermal diffusion of the heat radiated from the thermal source 13. A predetermined area is cut from the graphite sheet 11 so that the graphite sheet should not contact with the area penetrated by the conductive hole 6.

Figure 7:
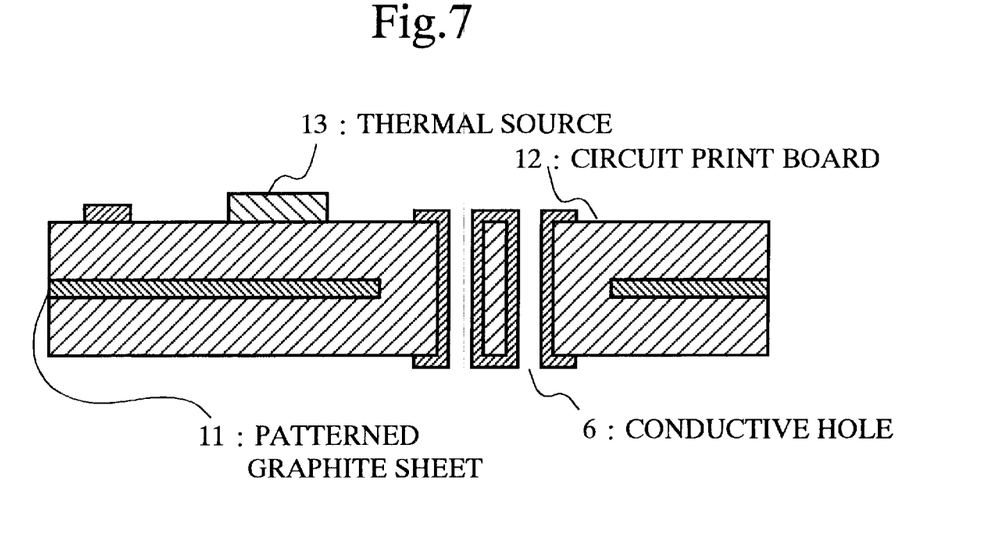
FIG. 7 is an end view showing the circuit print board 12 shown in FIG. 6 when vertically cut along the line A–A'.

FIG. 7 shows an end view of the circuit print board 12 shown in FIG. 6 vertically taken along the line A–A'. In FIG. 7, the conductive material is plated on the side surface of the conductive hole 6. Further, the patterned graphite sheet 11 is made by cutting a predetermined area to prevent contacting to the conductive hole 6. At the predetermined area, multiple conductive holes 6 are gathered. More than three conductive holes 6 can be located at one of the predetermined area.

Figure 8:
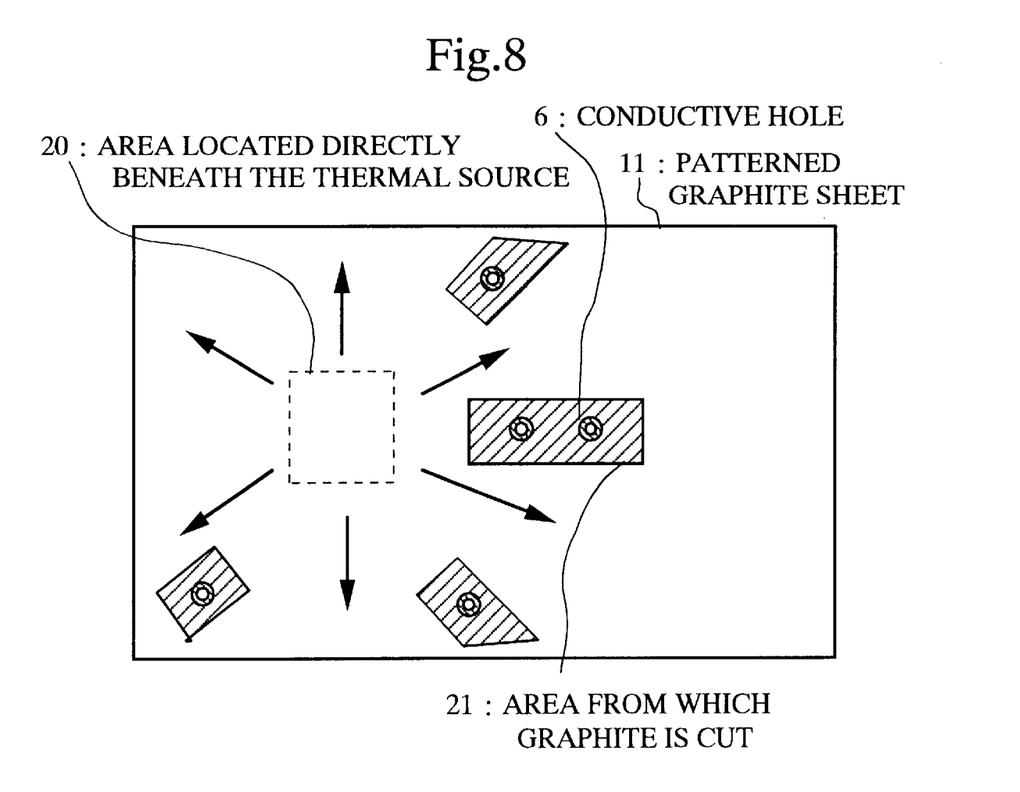
FIG. 8 is an end view showing the circuit print board 12 shown in FIG. 6 when cut in parallel along the line B–B'.

FIG. 8 shows an end view of the circuit print board shown in FIG. 6 horizontally taken along the line B–B'. The graphite sheet has a radial pattern cut as shown in FIG. 8. Within an area 21, from which the graphite is removed, there are multiple conductive holes 6. An area surrounded by a broken line within the patterned graphite sheet 11 shows an area 20 located directly beneath the thermal source. Arrows shown in FIG. 8 represent conceptual directions of the heat radiated from the thermal source 13 flowing on the surface of the graphite sheet. The following is the reason the graphite sheet has such a radial pattern.

Upon considering an effective diffusion of the heat radiated from the thermal source 13, it is desirable to insert the graphite sheet without pattern to the circuit print board 12. However, if such kind of graphite sheet is inserted to the circuit print board 12, the graphite sheet becomes electrically connected to the conductive hole 6. Accordingly, to prevent the contact of the graphite sheet with the conductive hole 6, the predetermined area of the graphite sheet should be cut. At this time, to perform an effective thermal diffusion, the area to be cut should be lessened as possible, and further, the area should be cut not to prevent the flow of the thermal current.

The thermal current radiated from the thermal source 13 radially flows on the surface of the graphite sheet from the area located directly beneath the thermal source 13 to perimeter area having lower temperature. Accordingly, from the view point of not to prevent the thermal current, it is desired to form the radial pattern along the flow of the thermal current as shown in FIG. 8.

The circuit print board 12 according to the third embodiment is constituted as described above, and the operation and effect will be explained below. The heat radiated from the thermal source 13 is transmitted to the graphite sheet. Since the thermal conductivity of the graphite sheet is better in the plane direction rather than the thickness direction, the heat transmitted from the thermal source 13 is diffused radially along the directions of arrows shown in FIG. 8 on the surface of the graphite sheet. The graphite is partially cut along the direction of the thermal diffusion, so that the thermal diffusion is not prevented so much by this cut area accordingly, the heat is effectively diffused from the thermal source 13, and the rise of the temperature around the thermal source 13 can be avoided.

Figure 9:
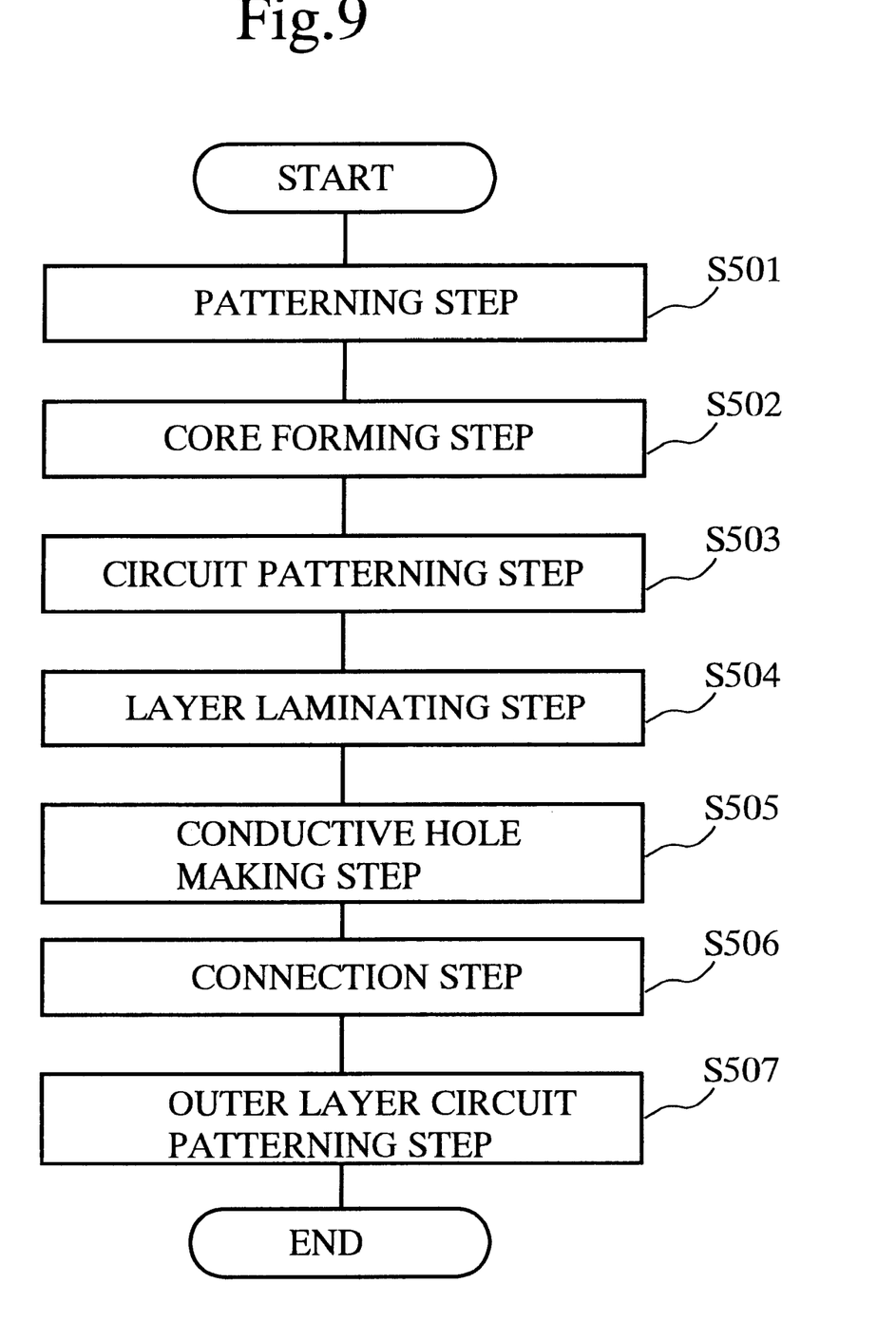
FIG. 9 is a flowchart showing a manufacturing method of the circuit print board according to the third embodiment.
Figure 10A:
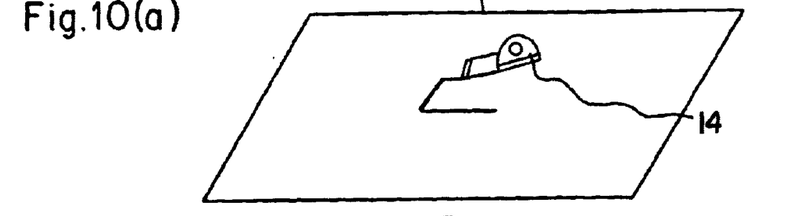
FIG. 10 shows a manufacturing process of the circuit print board according to the third embodiment.
Figure 10B:
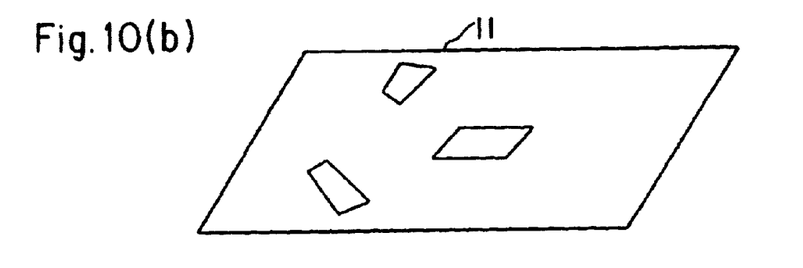
Figure 10C:
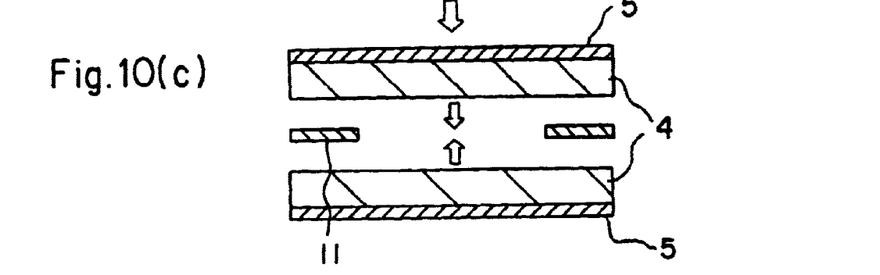
Figure 10D:
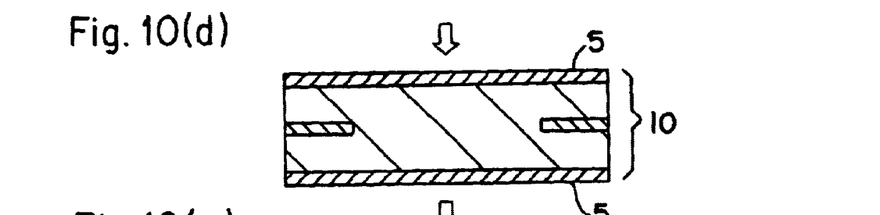
Figure 10E:
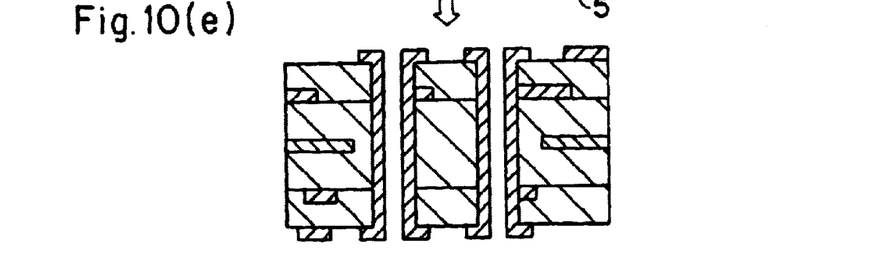

In the following, a manufacturing method of the multi-layered circuit board having the above patterned graphite sheet 11 inserted is explained. FIG. 9 is a flowchart showing manufacturing steps of the circuit print board according to the third embodiment. Further, FIG. 10 outlines the production process.

As shown in FIG. 9, the manufacturing method of the circuit print board according to the third embodiment has a patterning step S501. This is for making a radial pattern on the graphite sheet as shown in FIG. 8 so that the conductive hole 6 should not contact to the graphite sheet. To cut the predetermined pattern from the graphite sheet, for example, as shown in (a) of FIG. 10 a cutting tool such as a cutter 14 can be used, or laser can be used.

At the patterning step S501, the pattern can be made by cutting the predetermined area from the graphite sheet after bonding a sheet such as synthetic resin to the graphite sheet 1.

The area to be cut at the patterning step S501 should be cut so as to have enough space and be sufficiently large to include the gathered multiple conductive holes 6. By cutting the area in this way, the graphite sheet can be inserted to the circuit print board without requiring precise positioning.

To insert the patterned graphite sheet 11 to the circuit print board 12, the circuit should be designed so as to gather multiple conductive holes 6 within the predetermined area. However, recently, build-up method has been employed for forming the multilayered circuit having less number of the conductive holes 6 penetrating the board. Accordingly, the circuit can be effectively designed so as to gather penetrated multiple conductive holes 6 within the predetermined area.

Next, the manufacturing method of the circuit print board has a core forming step S502 as shown in FIG. 9. This is a step for forming the core 10 by bonding the insulator coated with the Cu film 5 to the patterned graphite sheet 11 as shown in (c) of FIG. 10. For the insulator to be bonded to the patterned graphite sheet 11, the glass epoxy resin 4, which is used for a usual circuit print board, can be used. The glass epoxy resin 4 can be plugged in the area, from which the graphite is removed, by thermally pressing the patterned graphite sheet 11 with the thermosetting glass epoxy resin 4 from both sides. By constituting the core forming step S502 as described above, additional step for plugging the insulator in the area, from which the graphite is removed, is not required. If necessary, adhesive can be coated on the patterned graphite sheet 11.

Thereafter, the manufacturing method of the circuit print board has a circuit patterning step S503, a layer laminating step S504, a conductive hole making step S505, a connection step S506, and an outer layer circuit patterning step S507. These steps are the same as steps explained in the first embodiment. That is, at the circuit patterning step S503, a circuit is patterned by performing resist coating, exposure/development, and etching process. At the layer laminating step S504, the multilayered circuit is formed. At the conductive hole making step, a hole is produced so as to electrically connect the circuits provided on the both sides of the graphite sheet 11. At the connection step S506, the conductive material such as copper is plated on the side surface of the conductive hole. At the outer layer circuit patterning step S507, a circuit is formed on the surface of the board.

The manufacturing method of the circuit print board according to the third embodiment is constituted as described above, and the operation and effect will be explained below.

As shown in (a) and (b) of FIG. 10, the predetermined area is removed from the graphite sheet 1 using a cutter 14 etc. to make the patterned graphite sheet 11 (the patterning step S501). Next, as shown in (c) and (d) of FIG. 10, the patterned graphite sheet 11 is thermally pressed by the glass epoxy resin 4 coated with the Cu (copper) film 5 from the both sides to form the core 10 (the core forming step S502). Then, the resist coating, exposure/development, etching process are performed to the Cu film 5 coated on the core 10 to form a circuit pattern (the circuit patterning step S503). Further, the glass epoxy resin 4, on one side of which the Cu film 5 is coated, is thermally pressed from both sides (the layer laminating step S504). Subsequently, the conductive hole 6 is produced on the multilayered circuit print board using the drill (the conductive hole making step S505), and the side surface of the produced conductive hole 6 is plated with copper (the connection step S506). Then, the circuit is patterned on the surface of the board (the outer layer circuit patterning step S507). In this way, the circuit print board having the patterned graphite sheet 11 shown in (e) of FIG. 10 inserted can be obtained.

Embodiment 4

In the explanation of the third embodiment, the cutting tool such as the cutter 14 or laser is used to make the patterned graphite sheet 11. In the fourth embodiment, a predetermined pattern is formed by pressing the graphite sheet 1 with a punch having a predetermined pattern.

The fourth embodiment has almost similar constitution to the third embodiment shown in FIG. 9. That is, the first step, the patterning step S501 is different, but the other steps from the core forming step S502 through the outer layer circuit patterning step S507 are the same.

Figures 11A, 11B, 11C, 11D, 11E:
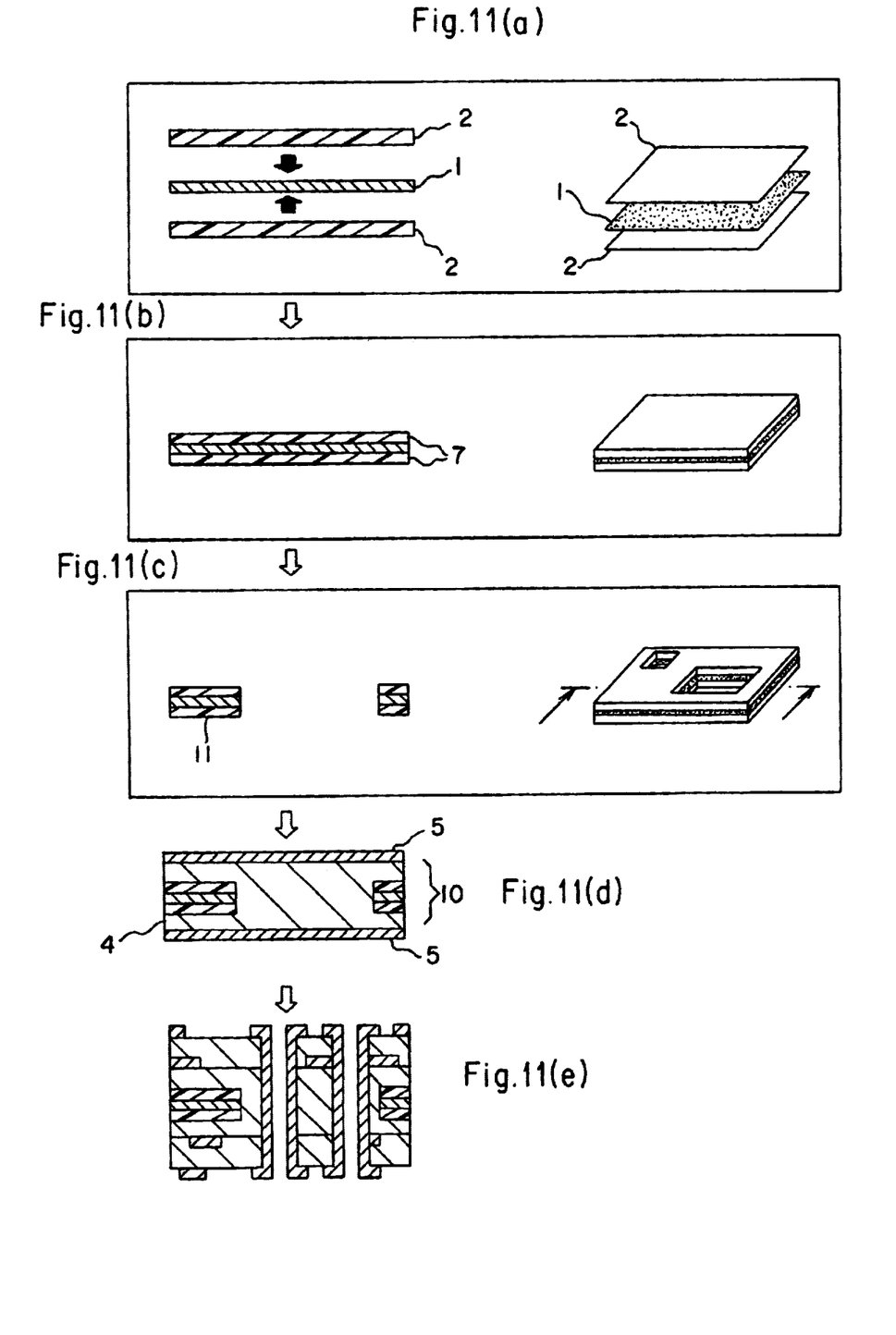
FIG. 11 shows a manufacturing process of the circuit print board according to the fourth embodiment.

The patterning step S501 has a sub-step for forming the thermal diffusive sheet 7 by bonding the resin 2 to the graphite sheet 1 as shown in FIG. 11. This sub-step is provided to strengthen the thin graphite sheet so as to become strong enough to be pressed by the punch having the predetermined pattern. Next, the patterning step has another sub-step for forming the patterned graphite sheet 11 by pressing the strengthened thermal diffusive sheet 7 with the punch having the predetermined pattern.

By constituting the patterning step S501 in this way, mass production of the board having the patterned graphite sheet 11 inserted can be implemented.

The manufacturing method of the circuit print board according to the fourth embodiment is constituted as described above, and the operation and effect will be explained below.

As shown in (a) of FIG. 11, the plate graphite sheet 1 is bonded with the resin 2, on which adhesive (not shown in the figure) is coated, from the both sides to form the thermal diffusive sheet 7 shown in (b) of FIG. 11. The thermal diffusive sheet 7 is pressed by the punch having the predetermined pattern, and the patterned graphite sheet 11 is made as shown in (c) of FIG. 11 (the patterning step S501). Next, as shown in (d) of FIG. 11, the glass epoxy resin 4 coated with the Cu (copper) film 5 is thermally pressed to form the core 10 (the core forming step S502). Then, through the same steps as the third embodiment, the circuit print board can be formed with the patterned graphite sheet 11 inserted.

Embodiment 5

Figure 12:
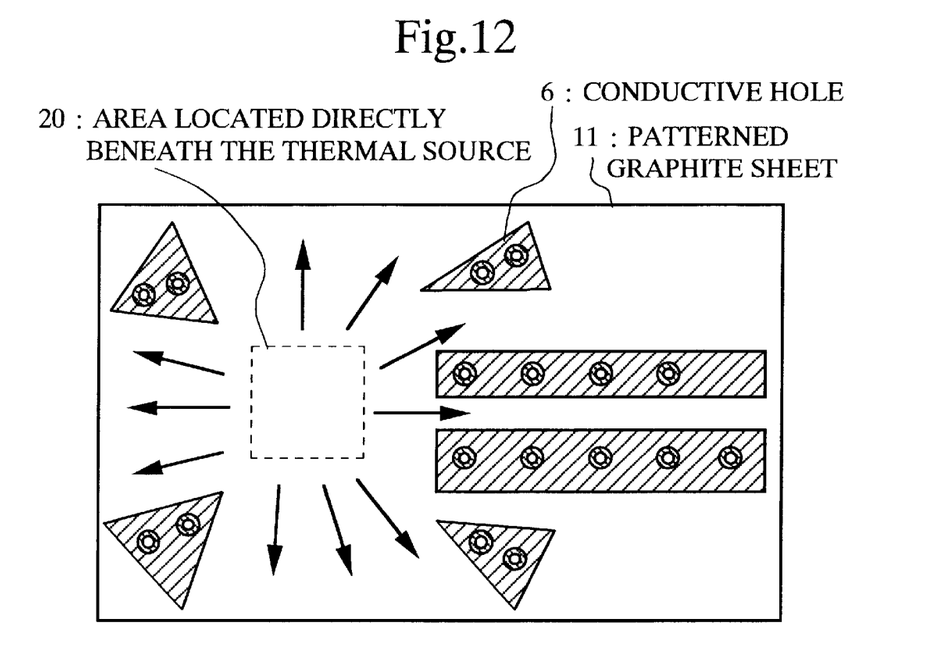
FIG. 12 shows an example of a patterned graphite sheet.

In the fifth embodiment, a modified example of the third embodiment will be described. In the third embodiment, the graphite sheet 11 having the pattern as shown in FIG. 8 is inserted to the circuit print board. However, what kind of pattern should be formed is determined so as not to prevent the direction of the thermal current of the heat radiated from the thermal source. Accordingly, the pattern is not limited to the pattern shown in FIG. 8. For example, as shown in FIG. 12, another pattern can be considered, where multiple triangles, one of the peaks of each of which is directed to the area 20 located directly beneath the thermal source, are located radially.

Figure 13:
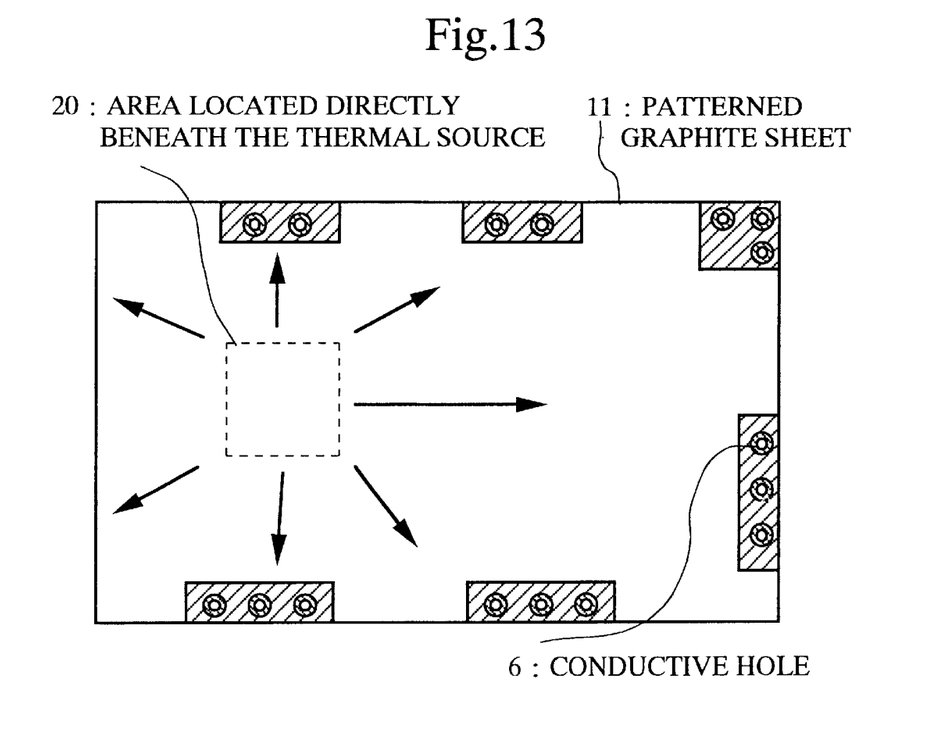
FIG. 13 shows another example of a patterned graphite sheet.

Further, in order to efficiently diffuse the heat radiated from the thermal source such as the heating element, it is preferable not to remove the graphite around the area 20 located directly beneath the thermal source. Accordingly, another pattern can be formed by cutting an end part of the graphite sheet as shown in FIG. 13.

Figure 14:
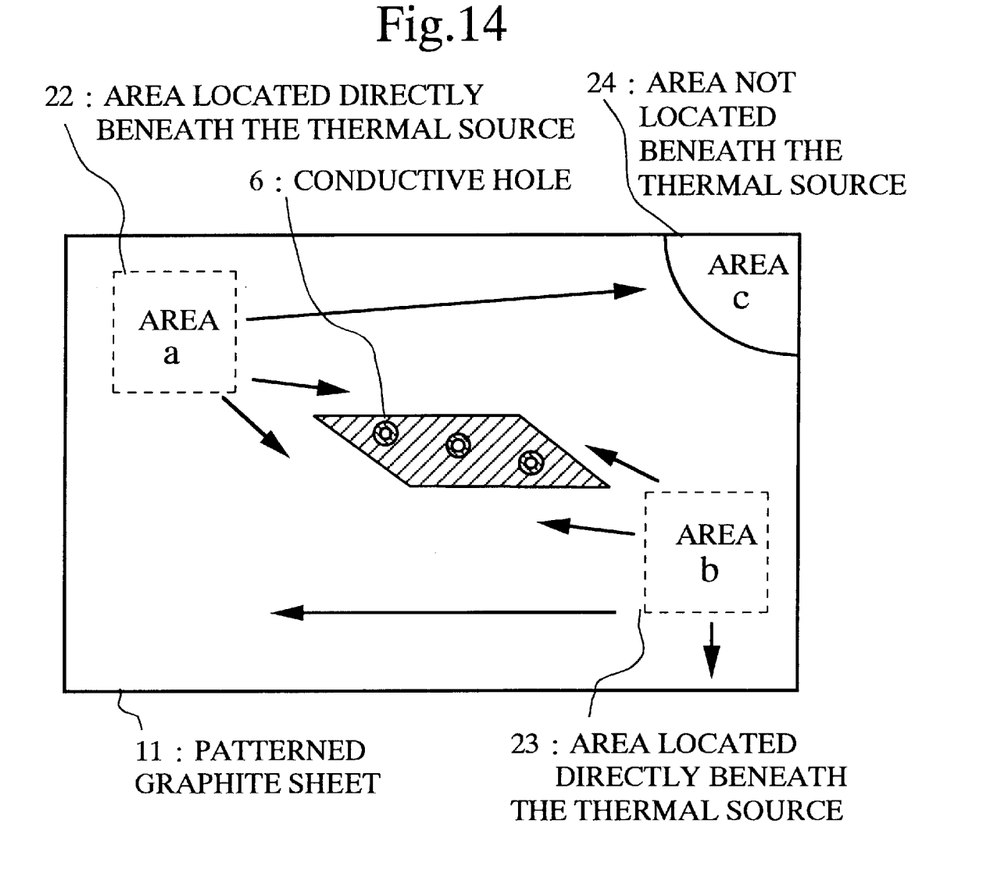
FIG. 14 shows another example of a patterned graphite sheet.

In the following, another case will be explained, in which multiple thermal sources exist. In FIG. 14, an area-a shows an area 22 located directly beneath a thermal source. Further, an area-b on the graphite sheet shows an area 23 located directly beneath a thermal source. On the other hand, an area-c on the graphite sheet shows an area 24, above which the thermal source does not exist. Here, the thermal current directly varies as a difference of the temperature between the areas. Namely, the greater the difference of the temperature between the areas is, the more the thermal current flows. Consequently, the thermal current flown from the area-a to the area-b is smaller than the thermal current flown from the area-a to the area-c. Accordingly, it can be considered not to prevent the thermal diffusion from the thermal source if an area located between the area-a and the area-b is removed. FIG. 14 shows an example of the patterning from the above view point.

Industrial Applicability

According to the present invention, it is obtained an effect to prevent the rise of the temperature of the heating element itself, the temperature of the circuit print board, the temperature of the frame of the electric device due to the heat radiated from the heating element such as the LSI and the power amplifier installed in the circuit print board as well as accomplishing down-sizing of the circuit print board.

Further, another effect can be obtained to easily produce the circuit print board having an efficient heat radiation using the manufacturing method of the circuit print board.

What is claimed is:

1. A method for manufacturing a circuit print board comprising:

a through hole making step for making a through hole penetrating a thermal diffusive sheet which is a carbon sheet bonded by substance supporting the carbon sheet; and an insulator bonding step for forming a core by bonding insulator to a side surface of the through hole made at the through hole making step.

2. The method for manufacturing the circuit print board according to claim 1, wherein the carbon sheet is a graphite sheet.

3. The method for manufacturing the circuit print board according to claim 1 further comprising:

a circuit patterning step for forming circuits on both sides of the core formed at the insulator bonding step;

a conductive hole making step for making a conductive hole penetrating the core with the circuits formed at the circuit patterning step; and a connection step for placing conductive material to a side surface of the conductive hole formed at the conductive hole making step.

4. The method for manufacturing the circuit print board according to claim 1 further comprising:

a conductive hole making step for making a conductive hole penetrating the core formed at the insulator bonding step;

a circuit patterning step for forming circuits on both sides of the core having the conductive hole made at the conductive hole making step; and a connection step for placing conductive material to a side surface of the conductive hole formed at the conductive hole making step.

5. The method for manufacturing the circuit print board according to claim 1 further comprising, before the through hole making step, a thermal diffusive sheet forming step for forming a thermal diffusive sheet by bonding substance supporting the carbon sheet to the carbon sheet.

6. The method for manufacturing the circuit print board according to claim 1, wherein the insulator bonding step bonds the insulator to the side surface of the through hole by compressing the insulator to the thermal diffusive sheet having the through hole made at the through hole making step.

7. The method for manufacturing the circuit print board according to claim 1, wherein the insulator bonding step bonds by plugging the insulator in the through hole made at the through hole making step.

8. The method for manufacturing the circuit print board according to claim 1, wherein the through hole making steps makes the through hole having a greater diameter than the conductive hole made at the conductive hole making step.

* * * * *